United States Patent [19]
> Cohlman

[11] 3,939,431
[45] Feb. 17, 1976

[54] MUTING CIRCUIT FOR A RADIO RECEIVER

[75] Inventor: Donald C. Cohlman, Rolling Meadows, Ill.

[73] Assignee: Motorola, Inc., Chicago, Ill.

[22] Filed: Nov. 25, 1974

[21] Appl. No.: 526,485

[52] U.S. Cl. ............................... 325/478; 325/348
[51] Int. Cl.[2] ........................................ H04B 1/10
[58] Field of Search .......... 325/313, 323, 371, 377, 325/348, 402, 456, 65, 473–478; 179/1 P, 1 VL, 1 SW; 178/DIG. 12; 328/108–111, 165

[56] References Cited
UNITED STATES PATENTS

| | | | |
|---|---|---|---|
| 3,437,937 | 4/1969 | Warfield | 325/478 |
| 3,564,419 | 2/1971 | Yackish | 325/478 |
| 3,603,884 | 9/1971 | Zaura, Jr. | 325/478 |
| 3,633,112 | 1/1972 | Anderson | 325/478 |
| 3,758,856 | 9/1973 | Fromm | 328/110 |
| 3,843,928 | 10/1974 | Nishimura et al. | 325/478 |

*Primary Examiner*—Robert L. Griffin
*Assistant Examiner*—Jin F. Ng
*Attorney, Agent, or Firm*—James W. Gillman; Eugene A. Parsons

[57] ABSTRACT

A zero crossing detector and one shot circuit connected to receive audio frequency signals from a receiver and provide a pulse each time the signal crosses a reference level, first and second one shot timers connected to receive the pulses and provide pulses in response thereto which coincide with the zero crossing of a predetermined signal it is desired to mute, coincidence gates receiving the one shot pulses and the delayed pulses and cooperating with a missing pulse detector and a relay in the receiver to mute the receiver whenever the pulses from either of the one shot timers coincide with the pulses from the zero crossing detector, which coincidence indicates a signal of the frequency it is desired to mute.

9 Claims, 2 Drawing Figures

MUTING CIRCUIT FOR A RADIO RECEIVER

BACKGROUND OF THE INVENTION

In communications systems which transmit data for visual display, by some means such as phase shift keyed sequences, and which also transmit voice messages it is desirable to mute the receiver during the transmission of the phase shift keyed data sequences so that the tones produced by these sequences are not audibly reproduced in the receiver. A system of this type is described in U.S. Pat. No. 3,906,445, entitled "Alphanumeric Terminal for a Communications System" and assigned to the same assignee. In this system the phase shift keyed data is transmitted first and is followed in the same transmission by any voice messages it is desired to transmit. Since the tones produced by the phase shift keyed data can be extremely irritable, many attempts have been made to mute the receiver during the data sequence without losing any of the voice message. Prior art structures include general data/voice discriminators which operate on the use of the fast Fourier transform. However, these circuits take a minimum of a few seconds to make a positive identification of either voice or data. Therefore, annoying tone bursts may still occur before muting and portions of the voice message may be muted.

SUMMARY OF THE INVENTION

The present invention pertains to a circuit for muting a radio receiver during the reception of data of a predetermined frequency including means providing pulses each time the data crosses a reference level and means triggered by the pulses for providing delayed windows or timing pulses at a subsequent time when the data will cross the reference level if it is a predetermined frequency and, thus, the data which it is desired to mute, the pulses and the timing pulses are applied to a coincidence gate and, if they coincide, the receiver is muted.

It is an object of the present invention to provide a circuit for muting a radio receiver during the reception of data or signals of a predetermined frequency.

It is a further object of the present invention to provide a circuit for muting a radio receiver during the reception of data of a predetermined frequency, which muting circuit is less complicated than prior art circuits and extremely fast at determining the existence of data or voice messages.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
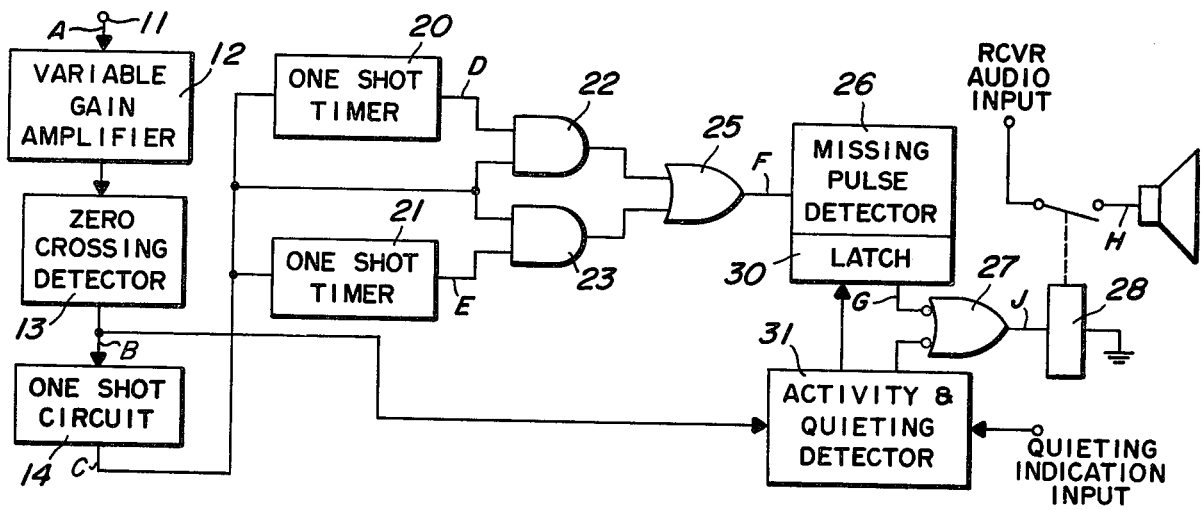
FIG. 1 is a block diagram of a circuit for muting a radio receiver embodying the present invention.

Referring specifically to FIG. 1, input means including an input terminal 11 and a variable gain amplifier 12 are connected to supply audio frequency signals to the input of a zero crossing detector 13. The input terminal 11 is connected to a radio receiver (not shown) to receive audio frequency signals therefrom, which audio frequency signals include data of a predetermined frequency or repetition rate and voice signals. In general, as set forth in the above described co-pending application, the voice signals will follow the data signals in the same transmission, however this is not essential to the present invention. The waveform of a typical transmission including a data signal followed by a voice signal is illustrated in FIG. 2 waveform A.

The zero crossing detector 13 may be any circuit which will provide an indication each time the audio frequency signal applied thereto crosses a reference level, such as zero. In the present embodiment the zero crossing detector 13 is an amplifier and limiter which converts the audio frequency signal to a series of square waves, shown inverted in FIG. 2B. Referring to FIG. 2, waveforms A and B, it can be seen that the zero crossings of the data (approximately the first half of the waveform) have a predetermined repetition rate. That is, the positive portions of the cycle are always of the same duration and the negative portions of the cycle are always of the same duration. It should be understood that the waveform illustrated is not essential to the present invention and any waveform having a predictable or reoccurring portion may be utilized.

Figure 2:
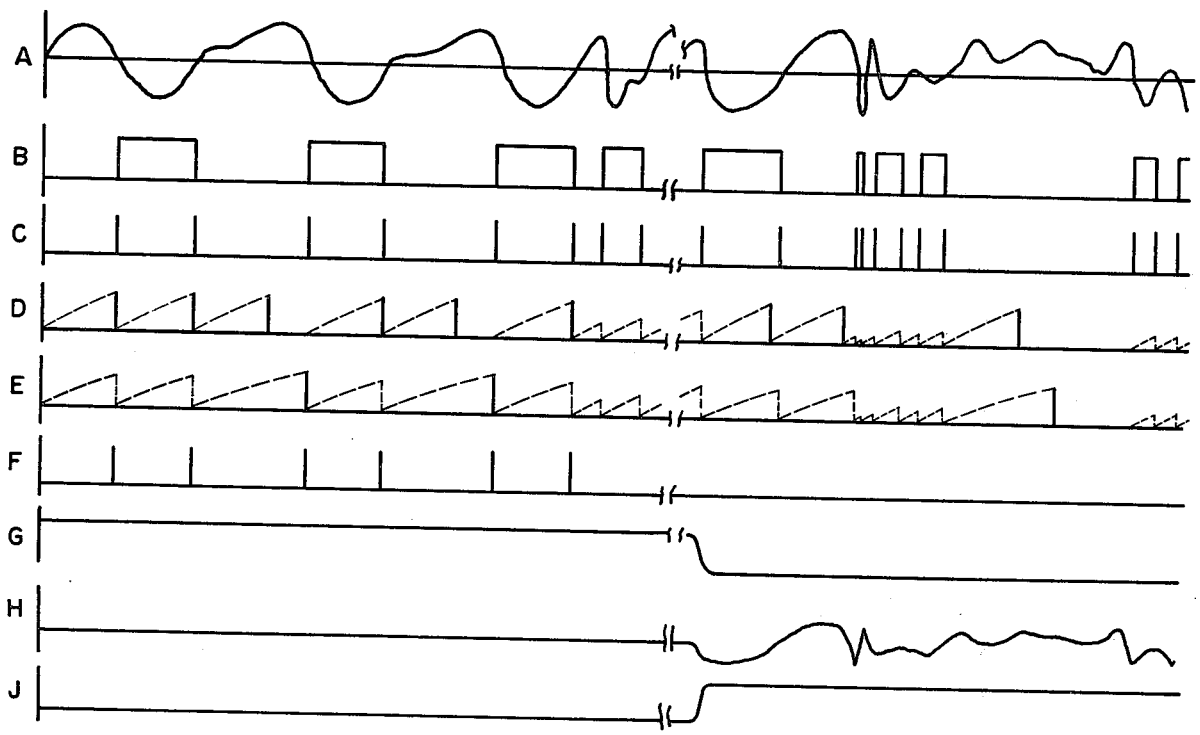
FIG. 2 illustrates a variety of waveforms, present in FIG. 1, and the time relationship therebetween.

The output of the zero crossing detector 13 is applied to a one shot circuit 14 which is constructed to supply a relatively sharp output pulse on the leading and trailing edges of the square waves received from the zero crossing detector 13, as illustrated in FIG. 2, waveform C. In the present embodiment the one shot circuit 14 is two one shot multi-vibrators one of which is connected to trigger on the leading edge of the square waves applied thereto and the other of which is constructed to trigger on the trailing edge of the square waves. The pulses supplied from the one shot circuit 14 thus appear at each zero crossing of the audio frequency signal applied to the circuit. The zero indicating pulses from the one shot circuit 14 are applied to a first one shot timer 20, a second one shot timer 21, one input of a first coincidence gate or AND circuit 22 and one input of a second coincidence gate or AND circuit 23.

The one shot timers 20 and 21 are each resettable timers which provide an output pulse a predetermined time after an input pulse is applied to the input thereof. Since the timers 20 and 21 are resettable, an output pulse will not appear if a second input pulse is supplied after a first input pulse and before the predetermined time has elapsed. Referring to FIG. 2, waveforms D and E, the output pulses of one shot timers 20 and 21, respectively, are illustrated. From these waveforms it can be seen that the one shot timer 20 supplies a pulse a predetermined time after a pulse (waveform C) is applied to the input thereof, which predetermined time is equal to the width of the negative portions of the data having the predetermined frequency, or the time between the leading and lagging edges of the positive going portion of the first three square waves in waveform B. The one shot timer 21 supplies an output pulse, illustrated in waveform E. a predetermined time after a pulse (waveform C) is applied to the input thereof, which predetermined time is equal to the width of the positive portions of the data having the predetermined frequency, or the time between the leading and lagging edges of the negative going portions between the first three square waves of the waveform B. The dotted lines in waveforms D and E indicate the time elapsed after a pulse is applied to the input of the one shot timers 20 and 21 and, if a second pulse is applied before the predetermined times for each of the timers 20 and 21 have elapsed, the timers 20 or 21 are reset without supplying an output pulse.

In the present embodiment the one shot timers 20 and 21 include two one shot multi-vibrators connected in series with the first multi-vibrator determining the delay and the second multi-vibrator determining the width of the output pulse. The output pulses from the one shot timers 20 and 21 are applied to the AND circuits 22 and 23, respectively, and act as windows to allow the AND circuits 22 and 23 to pass pulses from the one shot circuit 14 if they occur during one of the windows. Since the window or pulse supplied by the one shot timer 20 is delayed a time equal the duration of the negative portion of the data desired to be muted, pulses corresponding to the trailing edges of the first three positive square waves of waveform B will pass through AND circuit 22. Similarly, since the window or pulse produced by the one shot timer 21 is delayed a time equal to the duration of the positive portion of the data desired to be muted, pulses corresponding with the trailing edges of the two negative going portions between the first three positive square waves in the waveform B will pass through the AND circuit 23. Thus, the two one shot timers 20 and 21 and the coincidence gates or AND circuits 22 and 23 cooperate to sense the frequency or repetition rate of the pulses from the one shot circuit 14 and pass only pulses which correspond with the predetermined frequency or repetition rate of the data to be muted. While the one shot timers 20 and 21 provide a delay equal to the negative and positive portions of the data, it should be understood that a single one shot timer might be utilized to sense either the positive portion, the negative portion, an entire cycle, or any desired number of cycles if accuracy is not important. Further, more than two one shot timers might be utilized with additional AND gates to sense data having a different frequency if it is desired to mute more than one type of data. It will be noted from the waveforms of FIG. 2 that the one shot timers are triggered by input pulses to supply windows, on various occasions other than during the data desired to be eliminated, but there is no chance of a pulse appearing at the output of the one shot circuit 14 in coincidence with the windows unless the frequency of the signal applied to the one shot circuit 14 is the same as the data. The width of the output pulses or windows from the one shot timers 20 and 21 can be reduced to increase the accuracy or reliability of the circuit and reduce the possibility of passing pulses of the wrong frequency.

The output pulses from the AND circuits 22 and 23 are applied to an OR gate 25 which supplies a pulse to a missing pulse detector 26 whenever a pulse is applied to either of the inputs of the OR gate 25. Waveform F of FIG. 2 illustrates the pulses applied to the missing pulse detector 26 from the OR gate 25. The missing pulse detector 26 is in essence a timer which is continuously reset by incoming pulses as long as the pulses occur before the missing pulse detector 26 times out. The delay of the missing pulse detector 26 should be greater than the maximum time between pulses applied thereto (greater than the delay in the one shot timer 21) and may be several times greater to allow for the possibility of a missing pulse occurring because of improper processing, signal fading, etc. Once the missing pulse detector 26 times out, a signal is supplied through an OR gate 27 to energize a relay 28 and unmute the receiver, for example by connecting the speaker to the audio output.

The missing pulse detector 26 also contains a latch circuit 30 which receives an input from an activity and quieting detector 31. The activity and quieting detector 31 is connected to receive signals from the zero crossing detector 13 and to further receive a quieting indication from the radio receiver. As is well known by those skilled in the art, a communications receiver can supply a quieting signal or indication whenever signals, other than noise, are being received thereby. In the present embodiment, this quieting indication is supplied through the activity and quieting detector 31 to the latch 30. The missing pulse detector 26 is latched in the unmuted mode once it has timed out and the receiver is still receiving a signal, but the squelching of the receiver unlatches the detector 26. When the RF carrier is no longer present at the receiver (no signal being received) the receiver goes into a squelched condition and the quieting signal goes high. The rise of the quieting signal produces a single pulse in the activity and quieting detector, which includes for example a simple edge detector, and the single pulse opens the latch to allow the receiver to be muted. Thus, for signals such as that illustrated in waveform A of FIG. 2, the present circuit mutes the receiver during the data portion of the receiver and for the voice portion of the signal following the data, the missing pulse detector 26 is latched to prevent inadvertent muting of the receiver. The activity and quieting detector 31 also supplies a signal to the OR gate 27 to prevent operation of the relay 28 when no quieting or activity indication is supplied thereto, so that the receiver is muted when no signal is being received. The activity and quieting detector 31 receives an activity indication (signals) from the zero crossing detector 13 and quieting signals from the quieting indication input. A simple integrating circuit may be included in the detector 31 which provides a DC level at the output in response to any signals at the inputs. Thus, any activity or quieting indications result in a DC level at the input to the OR gate 27 which essentially opens the gate and allows a high signal from the detector 31 to pass therethrough and operate the relay 28 to unmute the receiver. If neither of the activity or quieting indications are present the output of the detector 31 is zero or low and the OR gate 27 is closed so that extraneous signals from the detector 26, caused by discriminator noise or the like in the receiver, cannot pass therethrough to unmute the receiver.

Thus, a circuit for muting a radio receiver has been disclosed, which circuit senses the reception of a predetermined signal and mutes the receiver during the reception to eliminate annoying bursts of noise from the receiver. Further, the circuit is extremely fast because it senses half cycles of the signal to be muted and does not require a long time to recognize the signal. Further, the speed and accuracy of the present circuit can be adjusted by adjusting the various delays in the circuitry to correspond with the requirements of the equipment to which it is attached. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A method of muting a radio receiver during the reception of audio frequency data or signals of a predetermined frequency, including the steps of:
   a. monitoring the audio frequency signals in the receiver and providing a pulse for each zero crossing thereof;
   b. using the pulses provided to produce a delayed window subsequent to each pulse, which window is delayed a period equal to the time between zero crossings of data of the predetermined frequency; and
   c. comparing the occurrence of the pulses and the windows and muting the receiver for a period longer than the delay between windows each time a pulse and a window coincide.

2. A circuit for muting a radio receiver during the reception of data or signals of a predetermined frequency, said circuit comprising:
   a. input means for receiving audio frequency signals from the radio receiver;
   b. zero crossing detector means connected to receive the audio frequency signals from said input means and supply an indicating pulse each time the amplitude of the audio frequency signals passes through a reference level;
   c. one shot timer means connected to receive the indicating pulses from the zero crossing detector means and supply a timing pulse a first predetermined time after the reception of each indicating pulse, the first predetermined time corresponding with a period between zero crossings of the predetermined frequency, and the timer means being reset when a second indicating pulse is applied thereto subsequent to a first indicating pulse and before the first predetermined time has elapsed;
   d. coincidence gate means coupled to said zero crossing detector means and said timer means for supplying an output pulse each time an indicating pulse and a timing pulse are coincidentally supplied thereto;
   e. missing pulse detector means connected to receive the output pulses from said coincidence gate means and supply a muting signal during the reception of a series of the output pulses, said missing pulse detector means providing an unmuting signal a second predetermined time after the reception of the last output pulse in the series, said second predetermined time being longer than said first predetermined time; and
   f. switch means coupled to said missing pulse detector means and said receiver for receiving the muting and unmuting signals and muting the receiver in response to the muting signal and unmuting the receiver in response to the unmuting signal.

3. A circuit for muting a radio receiver as claimed in claim 2 including an activity and quieting detector connected to receive indicating pulses from the zero crossing detector and quieting signals from the receiver and supply an output signal in the absence of both the pulses and the quieting signals, and an OR gate connected to receive the output signal from said activity and quieting detector and the muting signal from the missing pulse detector means and supply a muting signal to the switch means.

4. A circuit for muting a radio receiver as claimed in claim 2 including in addition latch means associated with the missing pulse detector means and coupled to receive a quieting signal from the receiver, said latch means operating to prevent said missing pulse detector from supplying a second muting signal subsequent to a first muting signal and during the presence of a quieting signal.

5. A circuit for muting a radio receiver as claimed in claim 2 wherein the switch means includes a relay.

6. A circuit for muting a radio receiver as claimed in claim 2 wherein the zero crossing detector means includes an amplifier and limiter for converting the audio frequency signals to square wave signals.

7. A circuit for muting a radio receiver as claimed in claim 6 wherein the zero crossing detector means includes in addition a one shot circuit that provides a relatively short indicating pulse at the beginning and end of each square wave and which supplies the indicating pulses to the one shot timer means.

8. A circuit for muting a radio receiver as claimed in claim 2 wherein the one shot timer means includes a first and a second one shot timer each having an input coupled to receive indicating pulses from the zero crossing detector means and an output supplying timing pulses to the coincidence gate means, the first timer supplying a timing pulse subsequent to receiving an indicating pulse a period of time equal to the time between the first and second zero crossings of a cycle of the signal having the predetermined frequency, and the second timer supplying a timing pulse subsequent to receiving an indicating pulse a period of time equal to the time between the second and third zero crossings of a cycle of the signal having the predetermined frequency.

9. A circuit for muting a radio receiver as claimed in claim 8 wherein the coincidence gate means includes first and second AND gates and an OR gate, said first AND gate being connected to receive timing pulses from the first timer and indicating pulses and supplying coincidence pulses to said OR gate, said second AND gate being connected to receive timing pulses from the second timer and indicating pulses and supplying coincidence pulses to said OR gate, and said OR gate supplying output pulses to the missing pulse detector means.

* * * * *